(12) United States Patent
Aghahassan et al.

(10) Patent No.: US 7,571,415 B2
(45) Date of Patent: Aug. 4, 2009

(54) LAYOUT OF POWER DEVICE

(75) Inventors: Houshang Aghahassan, Cupertino, CA (US); Albert Kuo Huei Yen, San Jose, CA (US); Chung-Che Reed, Taipei (TW); Tsung-Chien Wu, Hualien County (TW)

(73) Assignee: United Microelectronics Corp., Hsinchu (TW)

( * ) Notice: Subject to any disclaimer, the term of this patent is extended or adjusted under 35 U.S.C. 154(b) by 386 days.

(21) Appl. No.: 11/626,013

(22) Filed: Jan. 23, 2007

(65) Prior Publication Data

US 2008/0174371 A1    Jul. 24, 2008

(51) Int. Cl.
G06F 17/50 (2006.01)
H01L 27/088 (2006.01)
H03F 1/00 (2006.01)

(52) U.S. Cl. .............................. 716/17; 716/9; 716/10; 716/12; 716/13; 257/207; 257/341; 257/401; 257/500; 257/578; 257/691; 330/297; 330/123; 330/127; 330/199

(58) Field of Classification Search .................. 716/17, 716/9, 10, 12, 13; 257/207, 341, 401, 500, 257/578, 691; 330/297, 123, 127, 199
See application file for complete search history.

(56) References Cited

U.S. PATENT DOCUMENTS

| 3,863,232 | A | * | 1/1975 | Johnson et al. ............ 365/49.1 |
| 6,356,484 | B2 | * | 3/2002 | Dosaka et al. ......... 365/189.18 |
| 6,448,858 | B1 | | 9/2002 | Helms et al. |
| 6,833,756 | B2 | | 12/2004 | Ranganathan |
| 2005/0088881 | A1 | * | 4/2005 | Miki et al. ............. 365/189.09 |
| 2006/0108694 | A1 | | 5/2006 | Hung et al. |

FOREIGN PATENT DOCUMENTS

CN    1447592    10/2003

* cited by examiner

Primary Examiner—Phallaka Kik
(74) Attorney, Agent, or Firm—J.C. Patents

(57) ABSTRACT

A layout of a power device is provided. The layout includes a substrate, a unit array, a plurality of first, second, third and fourth signal paths, and a first, second, third and fourth port. The unit array with a plurality of rows is disposed on the substrate. Each row of the unit array includes a plurality of units. The first and second signal paths on the substrate are disposed on a first side and a second side of corresponding odd-numbered rows of the unit array. The third and the fourth signal paths on the substrate are disposed above a corresponding row of the unit array. The first to fourth ports on the substrate are electrically connected to the first to fourth signal paths respectively.

14 Claims, 7 Drawing Sheets

LAYOUT OF POWER DEVICE

BACKGROUND OF THE INVENTION

1. Field of the Invention

The present invention relates to a layout of an integrated circuit, and more particularly to a layout of a power device.

2. Description of Related Art

The power device (for example, a power amplifier) of an integrated circuit needs to have several groups of circuit units connected and output in parallel in order to satisfy the large power requirements of the next circuit stage. In some particular applications (for example, high frequency operations), the internal layout of the power device often directly affects the performance. For example, the non-symmetric connective relationships between transistors in the layout will often lead to mismatches. When micro-mismatch between the parallel-connected transistors of the power amplifier, one of the transistors may operate at a temperature environment higher than the other transistors. Since the operating current of a transistor is closely related to the temperature gradient, the foregoing transistor often operates with a larger operating current (or smaller operating current) than the others. Because the current output from the power amplifier is quite large, the current is often large enough to damage the mismatched transistor so that the remaining transistors must take up the total output current.

For complementary metal oxide semiconductor (CMOS) device, a rise in temperature will lead to a lowering of the current. Because the power amplifier drives a heavy load, a portion of the remaining transistors may malfunction due to the overheating resulting from the rise in temperature. When more and more transistors fail, the remaining transistors have to take up a heavier load. Thus, the more current flowing through the transistors, the higher will be the temperature. Ultimately, a chain reaction may occur to shut down the entire power amplifier.

In U.S. Pat. No. 6,448,858, the commonly used H-tree structure for the clock tree synthesizing of digital circuit is used to resolve the problem. This conventional technology provides a single-ended solution for a parallel-connected power amplifier. For radio frequency amplifiers, a larger power output is required to drive the next circuit stage. Therefore, a number of amplifying circuit units connected in parallel is required in the amplifier to provide a sufficiently large power output. To prevent different signal phases in each amplifying circuit unit, the conventional technique uses a symmetrical H-shaped layout design to transmit an input signal to each amplifying circuit unit. Through the H-shaped layout, approximately equal length between the signal input end and the amplifying circuit units are ensured and differences between the phases of input signals to the amplifying circuit units are avoided. Through the H-shaped layout, current can be evenly distributed to each transistor to avoid the mismatch problem. Although the conventional technique is able to confer geometric symmetry to the input signal paths, the same does not apply to the output signal paths. In other words, the layout cannot balance the input signal path and the output signal path at the same time. If the connectivity from each transistor to the next stage is too complicated, significant signal loss may result. For high frequency power amplifier, it is advantageous to have both the input signal path and the output signal path symmetrically balanced.

The foregoing technique is only applicable to single-ended circuits. In recent years, most analog or radio frequency signals use a differential circuit because it has better noise rejection. The foregoing H-shaped layout has difficulties applying to a differential circuit. If the H-shaped layout is applied to a differential pair, cross talk between metal interconnects is a problem.

SUMMARY OF THE INVENTION

Accordingly, the present invention is directed to a layout of a power device comprising a symmetrically balanced input signal path and a output signal path to reduce or eliminate the mismatch problems. The layout uses a simple wiring layout to reduce cross talk between metal interconnects. In addition, the layout in the present invention can be applied to a power device such as the singled-ended differential pair power device.

As embodied and broadly described herein, the invention provides a layout of a power device. The layout includes a substrate, a unit array, a plurality of first, second, third and fourth signal paths and a first, second, third and fourth port. The unit array with a plurality of rows is disposed on the substrate. Each row of the unit array includes a plurality of units. The first and second signal paths on the substrate is disposed on a first side and a second side of a corresponding odd-numbered row of the unit array. The third and the fourth signal paths on the substrate is disposed above a corresponding row of the unit array. The first to fourth ports on the substrate are electrically connected to the first to fourth signal paths respectively.

The present invention is also directed to another layout of a power device. The layout includes a substrate, a unit array, a plurality of first and second signal paths and a first and second port. The unit array with a plurality of rows is disposed on the substrate. Each row of the unit array includes a plurality of units. The first and second signal paths on the substrate is disposed on a first side and a second side of a corresponding odd-numbered row of the unit array. The first and second ports on the substrate are electrically connected to the first and second signal paths respectively.

Because the power device with symmetrically balanced input signal path and output signal path has a simple wiring layout, the mismatch problems may be reduced or eliminated and also cross talk between metal interconnects is reduced. In addition, the layout of the present invention may be applied to a singled-ended, differential pair power device.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
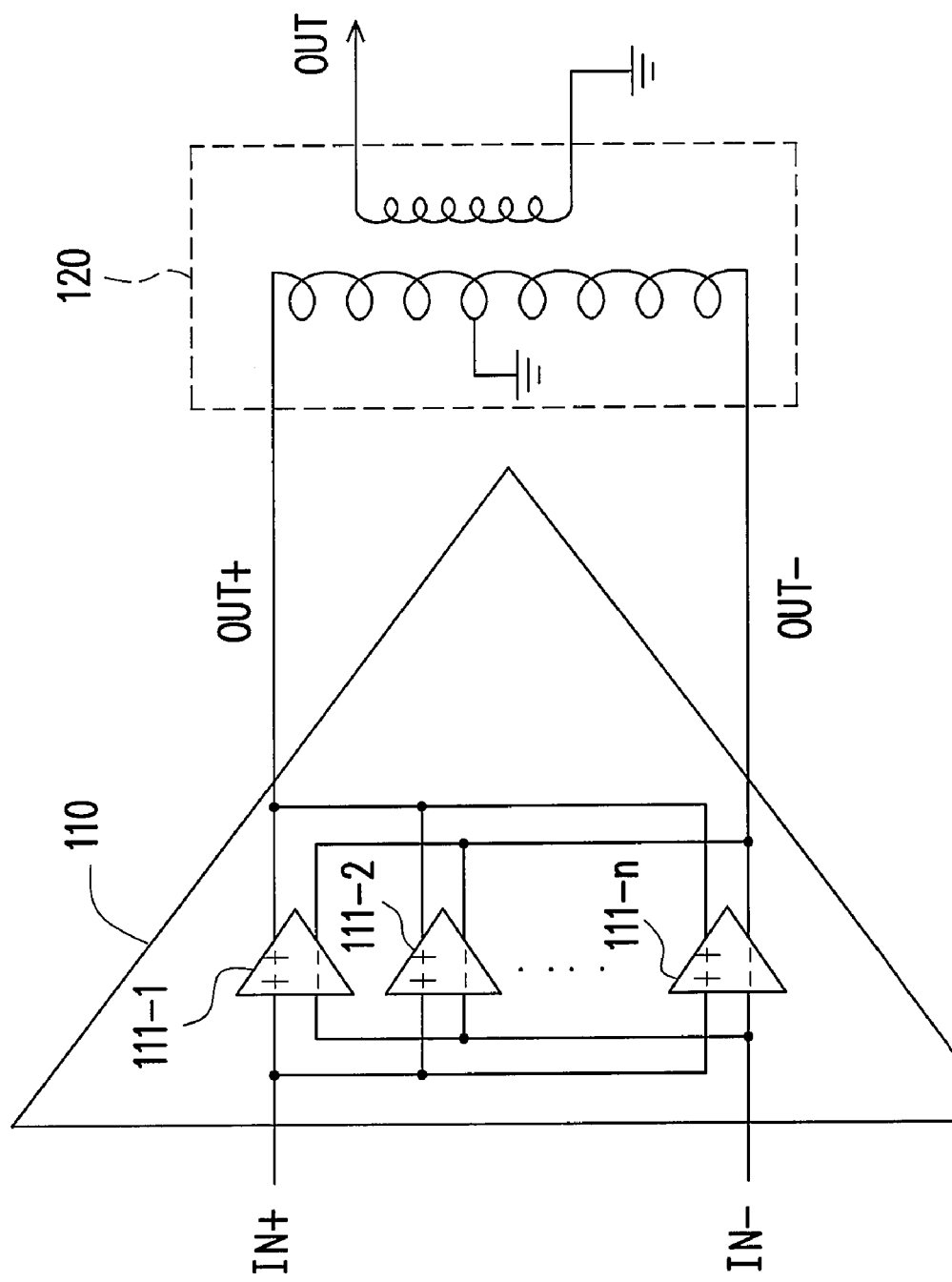
FIG. 1 is an application example of a power amplifier according to one embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

Power devices are mainly used to provide a large power-driving capability. Examples of power devices include buffer and power amplifier (PA). FIG. 1 is an application example of a power amplifier according to one embodiment of the present invention. Because differential signals have better noise rejection, most analog or radio frequency signals use a differential circuit. As shown in FIG. 1, the differential power amplifier 110 receives a differential signal pair through a first port (for example, the positive input port IN+) and a second port (for example, the negative input port IN−). After the differential signal pair is amplified, a large power differential signal pair is output through a third port (for example, the positive output port OUT+) and a fourth port (for example, the negative output port OUT−). The differential signal pair is output through the output ports OUT+ and OUT− to the next stage (for example, using a signal converter 120 implemented through a transformer, the signal converter 120 converts the differential signal pair into a single-ended signal OUT).

Because the power amplifier 110 has to provide a high power differential signal pair, the power amplifier 110 includes a plurality of parallel-connected units 111-1, 111-2, . . . , 111-n. Each of the units provides a portion of the output power. In other words, the units inside the power amplifier 110 are connected in parallel together to provide power that satisfies the power requirement of the next circuit stage. For some other applications (for example, high frequency operation), the layout inside the power amplifier 110 often has direct influence on its performance. For example, any non-symmetrical connecting relationship between the transistors may lead to mismatch. Therefore, the layout inside the power amplifier 110 from the input ports IN+ and IN− through the units 111-1~111-n to the output ports OUT+ and OUT− is a very important topic.

Figure 2:
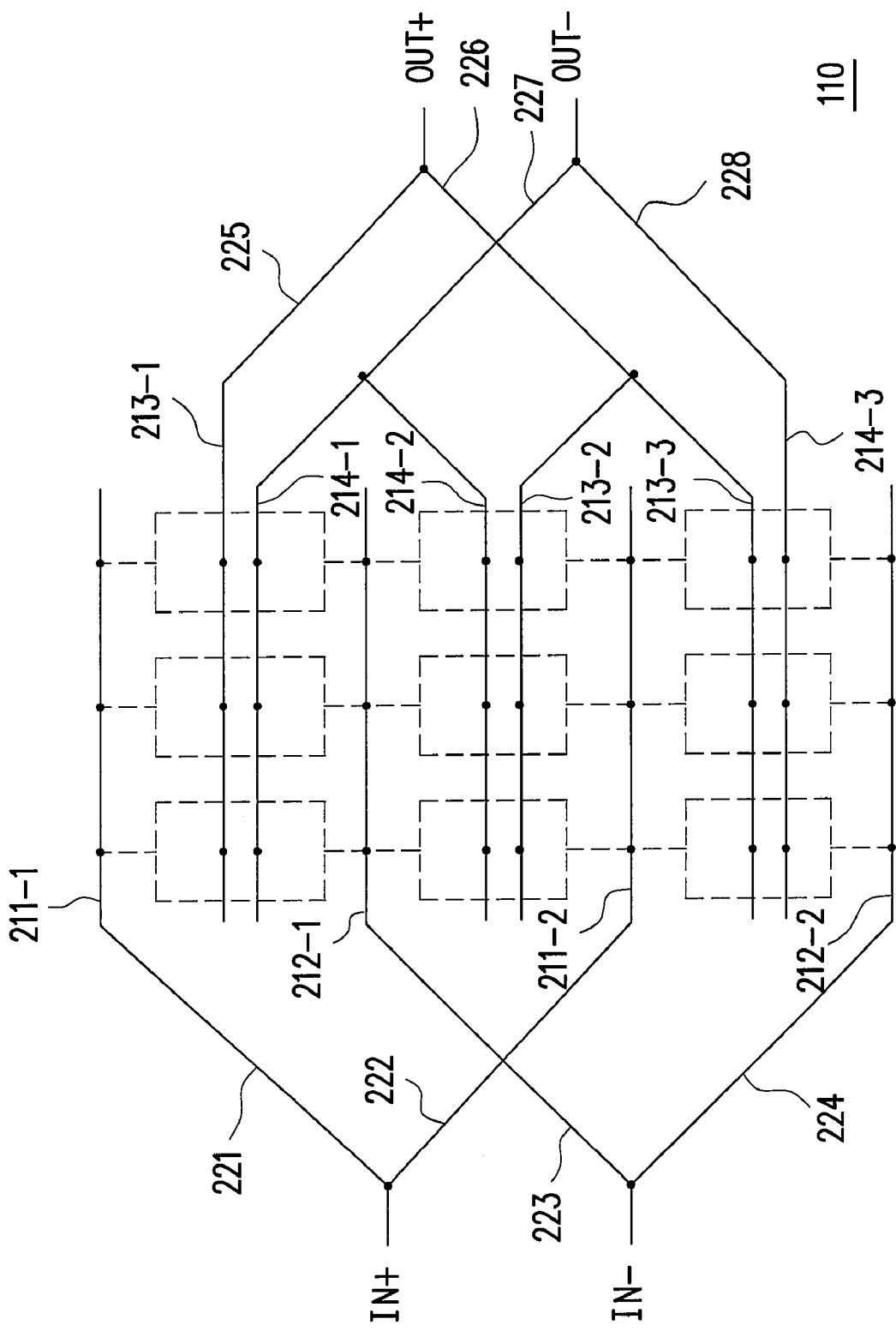
FIG. 2 is a sectional top view of an interior of a differential power amplifier in FIG. 1 according to one embodiment of the present invention.

FIG. 2 is a sectional top view of an interior of the differential power amplifier 110 in FIG. 1 according to one embodiment of the present invention. Referring to FIG. 2, neither the line width of the signal paths nor a detailed layout of each unit is shown. As shown in FIG. 2, one unit array (dash lines forming rectangular frames) with a plurality of rows is formed in a substrate. Each row comprises a plurality of units. In the present embodiment, a 3*3 unit array is used as an example. However, any one skilled in the art would be able to determine the number of rows and the number of units in each row according to the actual requirements. Furthermore, a plurality of first signal paths (for example, 211-1 and 211-2), a plurality of second signal paths (for example, 212-1 and 212-2), a plurality of third signal paths (for example, 213-1, 213-2 and 213-3) and a plurality of fourth signal paths (for example, 214-1, 214-2 and 214-3) are disposed over the substrate.

The first and second signal paths are disposed on a first side and a second side of a corresponding odd-numbered row of the unit array. For example, the first signal path 211-1 and the second signal path 212-1 are disposed on the first side and the second side of the first odd-numbered row (that is, the first row) of the unit array, and the first signal path 211-2 and the second signal path 212-2 are disposed on the first side and the second side of the second odd-numbered row (that is, the third row) of the unit array. The third and fourth signal paths are disposed over a corresponding row of the unit array. For example, the third signal path 213-1 and the fourth signal path 214-1 are disposed over the first row of the unit array, the third signal path 213-2 and the fourth signal path 214-2 are disposed over the second row of the unit array, and the third signal path 213-3 and the fourth signal path 214-3 are disposed over the third row of the unit array.

The first port IN+, the second port IN−, the third port OUT+ and the fourth port OUT− of the power amplifier 110 are disposed on the substrate. The first port IN+ is electrically connected to the first signal paths 211-1 and 211-2 through conductive lines 221 and 222. The second port IN− is electrically connected to the second signal paths 212-1 and 212-2 through conductive lines 223 and 224. The third port OUT+ is electrically connected to the third signal paths 213-1, 213-2 and 213-3 through conductive lines 225 and 226. The fourth port OUT− is electrically connected to the fourth signal path 214-1, 214-2 and 214-2 through conductive lines 227 and 228. In the present embodiment, the conductive lines 221~228 are disposed on the substrate at about 45° with respect to the horizontal plane, thereby forming an Y-shaped line connection. However, any one skilled in the art may choose other layout design such as disposing the conductive lines 221~228 at about 90°.

Figure 6:
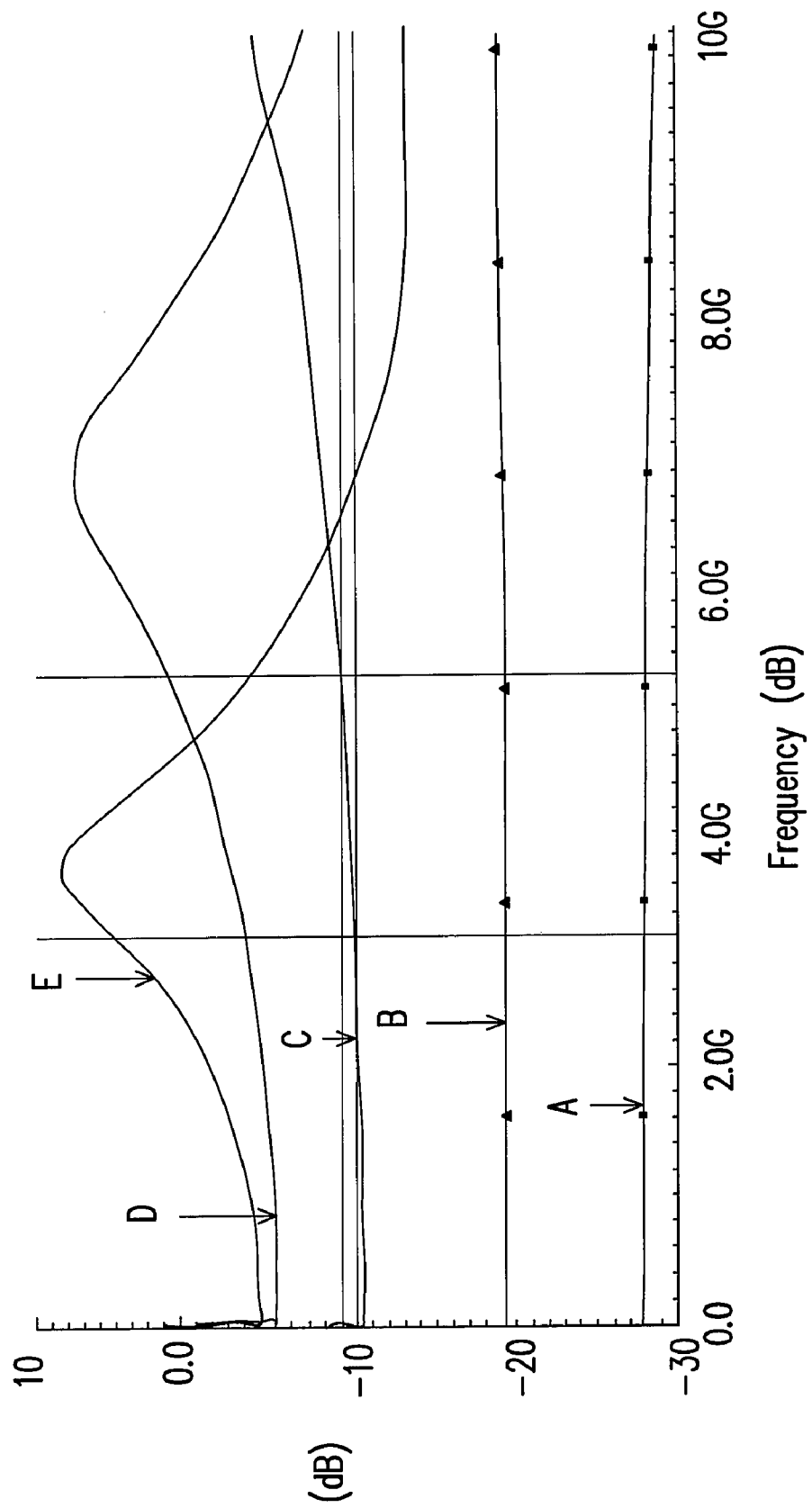
FIG. 6 is a graph showing the results of a simulation according to one embodiment of the present invention.

By determining the number of units in each row of the unit array, the signal dispersion of each signal path can be controlled. FIG. 6 is a graph showing the results of a simulation according to one embodiment of the present invention. In FIG. 6, curve A represents each row of the unit array having 5 units, curve B represents each row of the unit array having 10 units, curve C represents each row of the unit array having 20 units, curve D represents each row of unit array having 40 units, and curve E represents each row of the unit array having 80 units. It could be clearly seen from FIG. 6 that the larger the number of units in each row of the unit array, the lower would be the operating frequency. Thus, the users can decide the number of units in each row according to their design applications.

Figure 3:
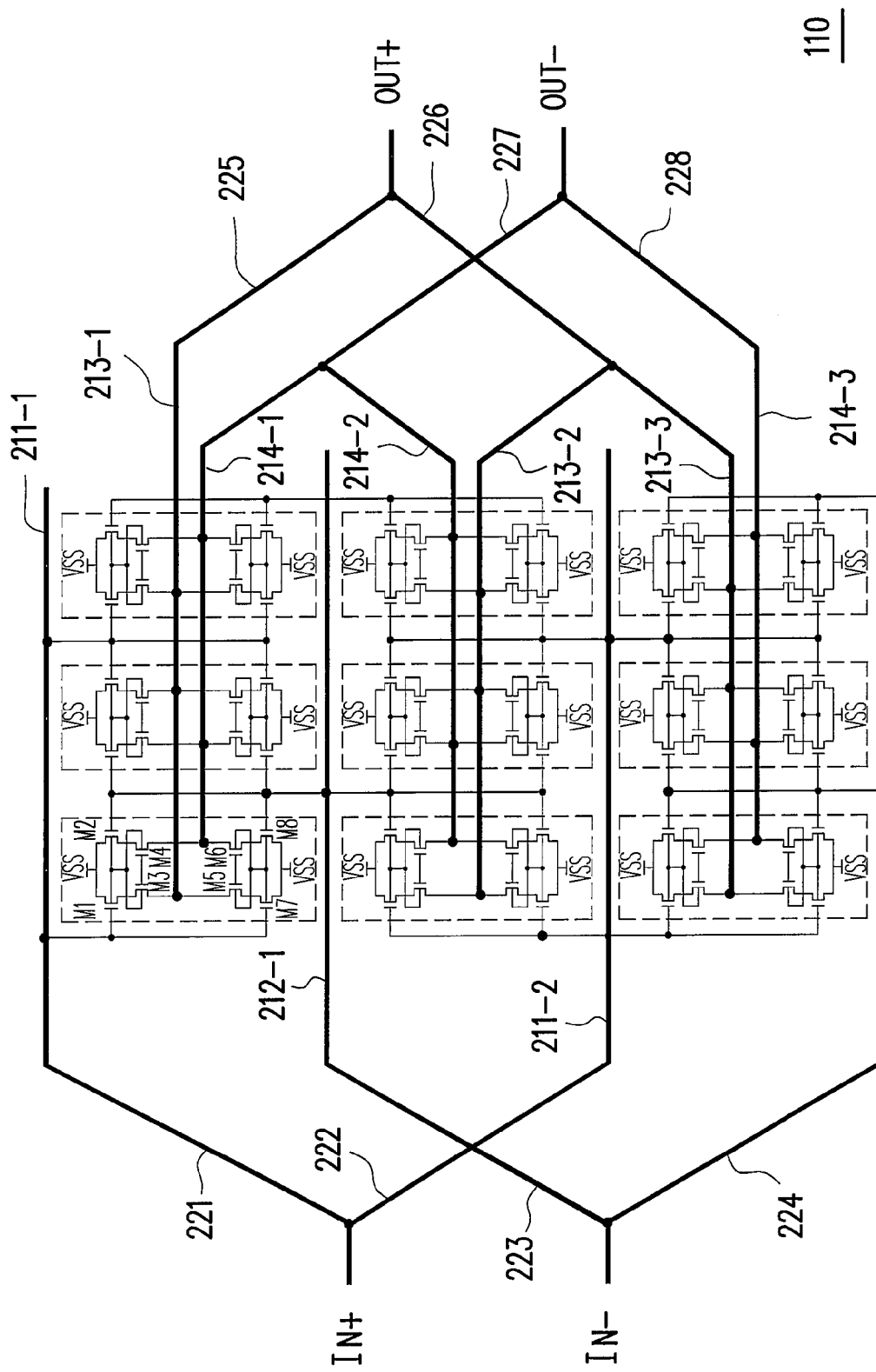
FIG. 3 is a diagram showing a circuit inside each unit of the power amplifier shown in FIG. 2 according to one embodiment of the present invention.

FIG. 3 is a diagram showing the circuit inside each unit of the power amplifier shown in FIG. 2 according to one embodiment of the present invention. As shown in FIG. 3, each dash line enclosed rectangular frame represents a single unit. In the present embodiment, the units of the power amplifier 110 are disposed back-to-back in the unit array. Each unit is an amplifying circuit comprising 8 N-channel metal oxide semiconductor (NMOS) transistors, for example. Using one of the units as an example, each unit includes NMOS transistors M1~M8. The NMOS transistors M1~M4 are formed in the same P-well, and the other NMOS transistors M5~M8 are formed in another P-well. The transistors M1, M3, M5 and M7 together form a first transistor series. The terminals of the transistor series are electrically connected to a voltage source trace VSS. The transistors M2, M4, M6 and M8 together form a second transistor series. The terminals of the second transistor series are also electrically connected to the voltage source trace VSS. The first and second transistor series form a differential pair. The gates of the transistors M1 and M7 serve as a first input terminal of the unit, and the gates of the transistors M2 and M8 serves as a second input terminal. The drains of the transistors M3 and M5 serve as a first output terminal of the unit, and the drains of the transistors M4 and M6 serve as a second output terminal of the unit. The first and second input terminals of the unit are electrically connected to their adjacent first signal path 211-1 and second signal path 212-1. The first and second output terminals of the unit are electrically connected to the third signal path 213-1 and the fourth signal path 214-1 across the unit.

Figure 4:
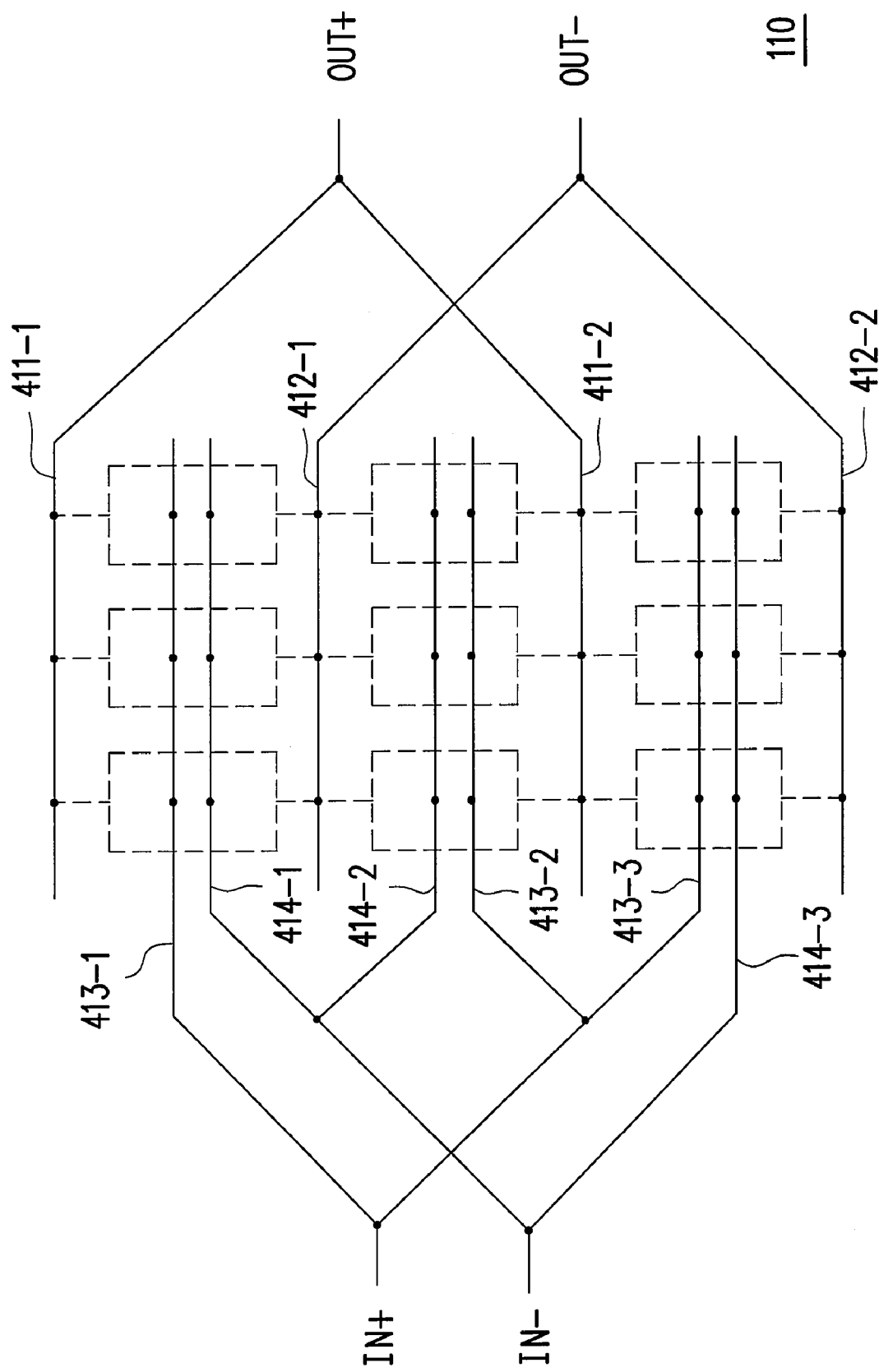
FIG. 4 is a sectional top view showing an interior of the differential power amplifier shown in FIG. 1 according to another embodiment of the present invention.

In the foregoing embodiment, the first port and signal path and the second port and signal path are used as the first and second input signal paths of the differential input signal pair of the power amplifier 110. Similarly, in the foregoing embodiment, the third signal path and port and the fourth signal path and port are used as the first and second output signal paths of the differential output signal pair of the power amplifier 110. However, the present invention also allows other methods of implementation. FIG. 4 is a top view showing part of the interior of the differential power amplifier 110 shown in FIG. 1 according to another embodiment of the present invention. Similar to FIG. 2, neither the line width of the signal path nor the layout of each unit is drawn in FIG. 4. Since some of the description for the embodiment of FIG. 4 may be found in the embodiment of FIG. 2, a detailed description of these similar areas is not repeated.

Figure 5:
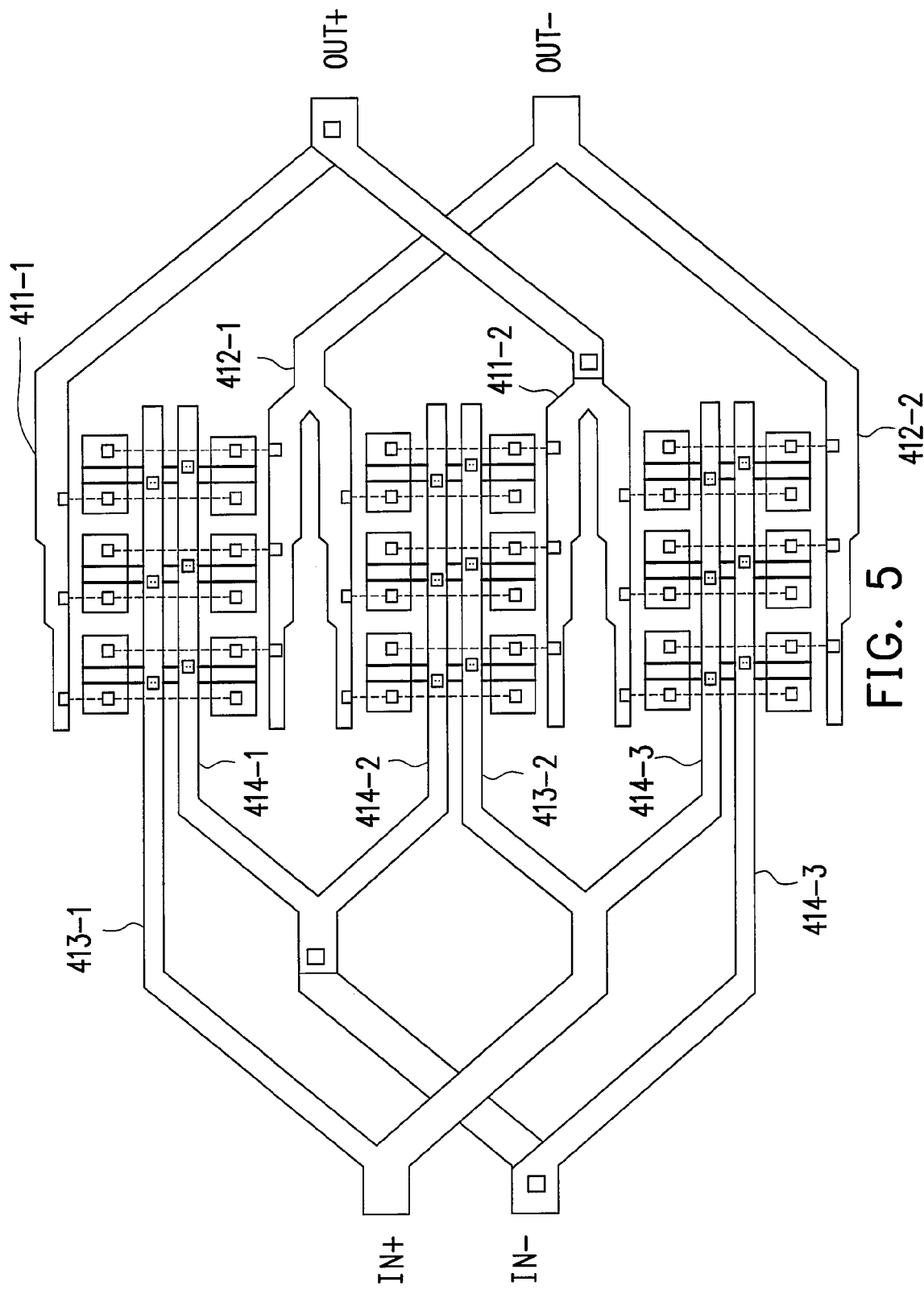
FIG. 5 is a top view showing an actual layout of FIG. 4 according to one embodiment of the present invention.

FIG. 5 is a top view showing the actual layout of FIG. 4 according to one embodiment of the present invention. As shown in FIGS. 4 and 5, a unit array (dash line enclosed rectangular frame in FIG. 4) with a plurality of rows is formed in a substrate. Each row of the unit array includes a plurality of units. In the present embodiment, a 3*3 unit array is used as an example. However, any one skilled in the art would be able to determine the number of rows and the number of units in each row according to the actual requirements. Furthermore, a plurality of first signal paths (for example, 411-1 and 411-2), a plurality of second signal paths (for example, 412-1 and 412-2), a plurality of third signal paths (for example, 413-1, 413-2 and 413-3) and a plurality of fourth signal paths (for example, 414-1, 414-2 and 414-3) are disposed over the substrate. The first signal path 411-1 and the second signal path 412-1 are disposed on the first side and the second side of a first odd-numbered row (that is, the first row) of the unit array, and the first signal path 411-2 and the second signal path 412-2 are disposed on the first side and the second side of a second odd-numbered row (that is, the third row) of the unit array. The third signal path 413-1 and the fourth signal path 414-1 are disposed over the first row of the unit array, the third signal path 413-2 and the fourth signal path 414-2 are disposed over the second row of the unit array, and the third signal path 413-3 and the fourth signal path 414-3 are disposed over the third row of the unit array.

In FIG. 4, the differential signal power amplifier 110 of the present embodiment receives a differential signal pair through the third port (for example, the positive input port IN+) and the fourth port (for example, the negative input port IN−). After the differential signal pair is amplified, a high power differential signal pair is output through the first port (for example, the positive output port OUT+) and the second port (for example, the negative output port OUT−). In the present embodiment, the third port IN+ and signal paths 413-1, 413-2, 413-3 and the fourth port IN− and signal paths 414-1, 414-2, 414-3 are respectively used as the first and second input signal paths of the differential signal pair of the power amplifier 110. On the other hand, the first signal paths 411-1, 411-2 and port OUT+ and the second signal path 412-1, 412-2 and port OUT− are respectively used as the first and second output signal paths of the differential signal pair of the power amplifier 110. Therefore, the first and second input terminals of each unit in the unit array are electrically connected to the third and fourth signal paths across the unit, and the first and second output terminals of each unit are electrically connected to adjacent first and second signal paths.

Figure 7:
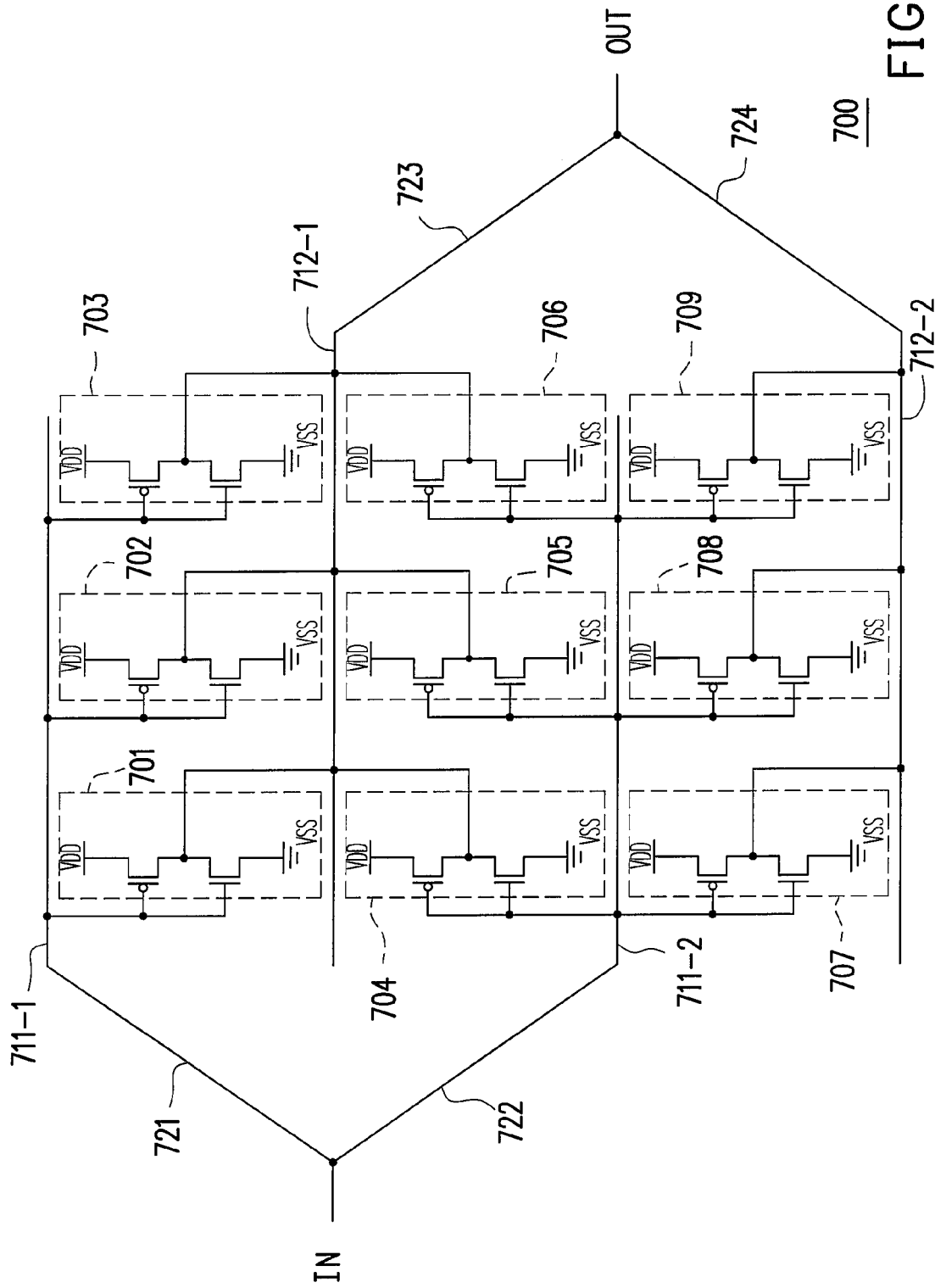
FIG. 7 is an application example of a single-ended inverter according to one embodiment of the present invention.

Although the foregoing embodiment implements the power amplifier of the present invention, other types of power amplifiers may also be used in the present invention. Furthermore, the layout in the present invention can be applied to single-ended and differential pair power devices. FIG. 7 is an application example of a single-ended inverter according to one embodiment of the present invention. As shown in FIG. 7, since the inverter 700 has to provide high power driving capability, the inverter 700 includes a plurality of parallel-connected units. Here, the units are arranged to form a unit array. FIG. 7 only shows a unit area with units 701~709, that is, the present embodiment uses a 3*3 unit array as an example. However, any one skilled in the art should be able to determine the number of rows and the number of units in each row according to the actual requirements. Each of the units provides a portion of the output power. In other words, the units 701~709 inside the inverter 700 are connected in parallel together to provide power that satisfies the power requirement of the next circuit stage. In FIG. 7, the line widths of the signal paths are not shown. A plurality of first signal paths (for example, 711-1 and 711-2) and a plurality of second signal path (712-1 and 712-2) are disposed over the substrate. The first signal path 711-1 and the second signal path 712-1 are disposed on a first side and a second side of a first odd-numbered row (the first row) of the unit array, and the first signal path 711-2 and the second signal path 712-2 are disposed on a first side and a second side of a second odd-numbered row (the third row) of the unit array.

The first port IN and the second port OUT of the inverter 700 are disposed over the substrate. The first port IN is electrically connected to the first signal paths 711-1 and 711-2 through conductive lines 721 and 722. The second port OUT is electrically connected to the second signal paths 712-1 and 712-2 through conductive lines 723 and 724. In the present embodiment, the conductive lines 721~724 are disposed on the substrate at about 45° with respect to the horizontal plane, thereby forming an Y-shaped line connection layout. However, anyone skilled in the art may choose other layout design such as disposing the conductive lines 721~724 at about 90°.

In the present embodiment, the units in the inverter 700 are disposed in the same direction in the unit array. However, the user may dispose the units back-to-back or some other disposing method in the unit array. Each unit is an inverter circuit comprising an NMOS transistor and a PMOS transistor, for example. Using a unit 701 as an example, the unit includes an NMOS transistor MN and a PMOS transistor MP. The transistor MN and the transistor MP are serially connected between power traces VDD and VSS. The gates of the transistors MN and MP serve as an input terminal of the unit 701. The input terminal of the unit 701 is electrically connected to the adjacent first signal path 711-1. The output terminal of the unit 701 is electrically connected to the adjacent second signal path 712-1.

In summary, the Y-shaped wiring layout used in the foregoing embodiment enables the signal current input through the input port to flow evenly to the active transistors of each unit and collects the output of each unit to the output port (to facilitate the transmission to another stage). By symmetrically balancing the input signal path and the output signal path, the signals are more uniformly distributed. Furthermore, the phases, amplitudes or delays are synchronized. Hence, the mismatch problems as in the case of the prior art may be reduced or eliminated and cross talk between metal interconnects may be reduced. Moreover, the layout of the present invention can be applied to a single-ended, differential pair power device.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A layout of a power device, comprising:
   a substrate;
   a unit array, disposed on the substrate, wherein the unit array has a plurality of rows and each row comprises a plurality of units;
   a plurality of first signal paths, disposed on the substrate, wherein the first signal paths are disposed on a first side of corresponding odd-numbered rows of the unit array;
   a plurality of second signal paths, disposed on the substrate, wherein the second signal paths are disposed on a second side of corresponding odd-numbered rows of the unit array;
   a plurality of third signal paths, disposed on the substrate, wherein the third signal paths are disposed over corresponding rows of the unit array;
   a plurality of fourth signal paths, disposed on the substrate, wherein the fourth signal paths are disposed over corresponding rows of the unit array;
   a first port, disposed on the substrate and electrically connected to the first signal paths;
   a second port, disposed on the substrate and electrically connected to the second signal paths;
   a third port, disposed on the substrate and electrically connected to the third signal paths; and
   a fourth port, disposed on the substrate and electrically connected to the fourth signal paths.

2. The power device of claim 1, wherein conductive lines between the first, second, third and fourth ports and the first, second, third and fourth signal paths are disposed at about 45° angle on the substrate relative to a surface of the substrate.

3. The power device of claim 1, wherein the units are disposed back-to-back in the unit array.

4. The power device of claim 1, wherein the first, second, third and fourth ports serve as the first and second input ports and the first and second output ports of the power device respectively.

5. The power device of claim 4, wherein a first input terminal and a second input terminal of each unit of the unit array are electrically connected to an adjacent first and second signal paths, and a first output terminal and a second output terminal of each unit are electrically connected to the third and fourth signal paths.

6. The power device of claim 1, wherein the first, second, third, fourth ports serve as the first and second output ports and the first and second input ports of the power device respectively.

7. The power device of claim 6, wherein a first input terminal and a second input terminal of each unit of the unit array are electrically connected to the third and fourth signal paths across the unit, and a first output terminal and a second output terminal of each unit are electrically connected to adjacent first and second signal paths.

8. The power device of claim 1, wherein the power device comprises a power amplifier and each unit comprises an amplifying circuit.

9. A layout of a power device, comprising:
   a substrate;
   a unit array, disposed on the substrate, wherein the unit array has a plurality of rows and each row comprises a plurality of units;
   a plurality of first signal paths, disposed on the substrate, wherein the first signal paths are disposed on a first side of corresponding odd-numbered rows of the unit array;
   a plurality of second signal paths, disposed on the substrate, wherein the second signal paths are disposed on a second side of corresponding odd-numbered rows of the unit array;
   a first port, disposed on the substrate and electrically connected to the first signal path; and
   a second port, disposed on the substrate and electrically connected to the second signal path.

10. The power device of claim 9, wherein conductive lines between the first and second ports and the first and second signal paths are disposed at about 45° angle on the substrate relative to a surface of the substrate.

11. The power device of claim 9, wherein the first and the second port serve as an input port and an output port of the power device.

12. The power device of claim 11, wherein an input terminal and an output terminal of each unit of the unit array are electrically connected to adjacent first and second signal paths.

13. The power device of claim 9, wherein the first and the second port serve as an output port and an input port of the power device.

14. The power device of claim 13, wherein an input terminal and an output terminal of each unit of the unit array are electrically connected to adjacent second and first signal paths.

* * * * *